United States Patent
Walsh et al.

(10) Patent No.: US 7,463,710 B2
(45) Date of Patent: Dec. 9, 2008

(54) FRACTIONAL-N SYNTHESIZER AND METHOD OF PROGRAMMING THE OUTPUT PHASE

(75) Inventors: Patrick Walsh, Limerick (IE); Michael F. Keaveney, Lisnagry (IE)

(73) Assignee: Analog Devices, Inc., Norwood, MA (US)

( * ) Notice: Subject to any disclaimer, the term of this patent is extended or adjusted under 35 U.S.C. 154(b) by 271 days.

(21) Appl. No.: 10/826,067

(22) Filed: Apr. 16, 2004

(65) Prior Publication Data

US 2004/0264622 A1 Dec. 30, 2004

Related U.S. Application Data

(60) Provisional application No. 60/483,412, filed on Jun. 27, 2003.

(51) Int. Cl.
*H03D 3/24* (2006.01)
(52) U.S. Cl. .................. 375/376; 375/373; 375/327; 327/156; 331/1 A; 331/25
(58) Field of Classification Search .......... 375/376, 375/372, 327, 373; 331/1 A, 25; 327/156
See application file for complete search history.

(56) References Cited

U.S. PATENT DOCUMENTS

| | | | | |
|---|---|---|---|---|
| 6,353,649 | B1 * | 3/2002 | Bockleman et al. | 375/376 |
| 6,556,086 | B2 | 4/2003 | Keaveney et al. | 331/1 A |
| 6,600,378 | B1 * | 7/2003 | Patana | 331/1 A |
| 6,614,319 | B2 * | 9/2003 | Saeki et al. | 331/17 |
| 6,621,317 | B2 * | 9/2003 | Saeki | 327/163 |
| 6,642,800 | B2 * | 11/2003 | Drapkin et al. | 331/16 |
| 2002/0191727 | A1 * | 12/2002 | Staszewski et al. | 375/376 |

* cited by examiner

*Primary Examiner*—Ted Wang
(74) *Attorney, Agent, or Firm*—Iandiorio Teska & Coleman (57) ABSTRACT

A fractional-N synthesizer with programmable output phase including a phase locked loop having an output signal whose frequency is a fractional multiple of an input reference signal, the phase locked loop including a frequency divider. A synchronization circuit responsive to the input reference signal for generating synchronization pulses at integer multiples of M periods of the input reference signal. An interpolator is responsive to F and M, where F is the fractional value and M is the modulus, to provide to the frequency divider an output which is a fractional value equal to, on average, the input fraction. A phase adjustment circuit is responsive to the synchronization circuit for varying the phase of the output signal with respect to the input reference signal.

13 Claims, 5 Drawing Sheets

FRACTIONAL-N SYNTHESIZER AND METHOD OF PROGRAMMING THE OUTPUT PHASE

RELATED APPLICATIONS

This application claims priority of U.S. Provisional Application No. 60/483,412, filed on Jun. 27, 2003, entitled "Fractional-N Synthesizer With Programmable Output Phase."

FIELD OF THE INVENTION

This invention relates to a fractional-N synthesizer and method with programmable output phase.

BACKGROUND OF THE INVENTION

In a phase locked loop (PLL) the output signal is phase and frequency locked to an input reference signal. A PLL with a frequency divider inserted in the feedback loop can be used to make an integer-N frequency synthesizer. In that case the signal at the phase detector negative input is phase and frequency locked to the reference. The output frequency and phase is N times the reference frequency and phase. Output frequencies can be synthesized in steps of the reference frequency by programming the value of N. There are exactly N periods of the output for every period of the reference and therefore one rising edge of the output in every N is in phase with each rising edge of the reference. For any given value of N the phase of the output relative to the reference is fixed and is the same each time the synthesizer is switched back to that frequency channel. In a fractional-N synthesizer, the divider in the feedback path has an integer and fractional part and the output frequency step resolution is a fraction of the reference frequency, as shown in equation 1:

$$f_{OUT} = \left(N + \frac{F}{M}\right) \times f_{REF} \qquad (1)$$

The fractional part is generated using a digital interpolator. This outputs a sequence of integer values with an average value given by F/M where F is the input fraction and M is the modulus. The modulus M can also be programmable or it may be fixed for a given implementation.

The interpolator could be, for instance, a single accumulator with the overflow bit as output or it could be a higher order sigma-delta modulator. There are numerous prior art examples of both architectures.

Fractional-N synthesizers have a number of advantages which make them desirable. Their output steps are in fractions of the reference frequency. This allows the use of larger input reference frequencies which in turn allows N to be smaller. This is a major advantage because phase noise gain from input to output is a function of $N^2$ or 20 Log N in dB's so the noise can be much reduced by even a small reduction in N. Also, the availability of a larger reference frequency allows a wider loop bandwidth which in turn allows a shorter settling time each time the synthesizer is switched from one frequency channel to another.

By rewriting equation (1) as follows:

$$f_{OUT} = (MN + F) \times \frac{f_{REF}}{M} \qquad (2)$$

it is clear that the output will only be in phase with one out of every M edges of the input reference. This highlights a major disadvantage of fractional-N synthesizers in that the output phase can have any one of M possible values with respect to the input reference phase, where M is the fractional modulus. Which one of the M edges of the reference this will be may be different each time the channel is synthesised depending on the particular state of the interpolator when the new N and F values, which specify the channel to be synthesised, are loaded. In some applications this doesn't matter but when it is required that a particular output frequency signal has consistently the same phase relationship with a reference then this is a problem with a fractional-N synthesizer.

Prior fractional-N synthesizers have been designed to synchronize the phase output signal with the input reference signal. For example, U.S. Pat. No. 6,556,086, entitled "Fractional-N Synthesiser And Method Of Synchronisation Of The Output Phase", incorporated herein by reference, generates a synchronization pulse at integer multiples of periods of the input reference signal and gates one of those synchronization pulses to re-initialize the interpolator of the fractional-N synthesizer in order to synchronize the phase of the output signal with the input reference signal. The design of the '086 patent produces an output signal with a resultant phase which is phase locked to the input reference signal for channels at the same frequency. One drawback of the design of the '086 patent is that it cannot be programmed to vary phase of the output signal with respect to the input reference signal. Varying the output frequency in a fractional-N synthesizer is useful in applications such as wireless systems (e.g., cellular phones) where two or more channels at the same frequency need to have different phases to reduce interference. Other possible applications of a fractional-N synthesizer with programmable output phase include phased radar systems wherein RF waves are transmitted at the same frequency but at different phases to form constructive and destructive interference, e.g., beam forming, where the beam needs to be focused on objects in the sky. Other beam forming applications of a fractional-N synthesizer with programmable output phase may include focusing RF waves of broadcasting/transmitting stations located on the coast only in the direction of the proximate land.

SUMMARY OF THE INVENTION

It is a primary object of this invention to provide a fractional-N synthesizer and method with programmable output phase.

This invention results from the realization that a truly simple and effective fractional-N synthesizer with programmable output phase can be achieved by generating synchronization pulses at integer multiples of periods of the input reference signal and re-initializing the interpolator with a synchronization pulse to define the phase of the output signal or resetting the interpolator with a predetermined phase adjustment value to vary the phase of the output signal. This invention results from the further realization that an innovative fractional-N synthesizer with programmable output phase can be achieved by tracking the accumulated fractional phase, scaling the accumulated fractional phase by a predetermined phase adjustment value, and loading the predetermined phase adjustment value into the interpolator to generate a predetermined output frequency and phase.

This invention features a fractional-N synthesizer with programmable output phase including a phase locked loop having an output signal whose frequency is a fractional multiple of an input reference signal. The phase locked loop includes a frequency divider, a synchronization circuit responsive to the input reference signal for generating synchronization pulses at integer multiples of M periods of the input reference signal. An interpolator is responsive to an input fraction F and M, where F is the fractional value, and M is the modulus, to provide to the frequency divider an output which is a fractional value equal to, on average, the input fraction F/M. A phase adjustment circuit responsive to the synchronization circuit for varies the phase of the output signal with respect to the input reference signal.

In one embodiment, the adjustment circuit may include a switching circuit for selectively applying the fractional value and the modified fractional value to the interpolator to define a predetermined phase relationship between the output signal and the input reference signal. The switching circuit may include an adder circuit for adding the fraction value and a predetermined phase adjustment value to define the modified fractional value. The switching circuit may include a multiplexer configured to select the modified fractional value or the fractional value for one or more reference cycles. The fractional value may be offset by a phase word to define the modified fractional value. The phase word may have a size in the range of 0 to M−1.

This invention also features a fractional-N synthesizer with programmable output phase including a phase locked loop having an output signal whose frequency is a fractional multiple of an input reference signal. The phase locked loop includes a frequency divider, a synchronization circuit responsive to the input reference signal for generating synchronization pulses at integer multiples of M periods of the input reference signal, a phase register including a predetermined phase adjustment value, and an interpolator responsive to F and M, where F is the fractional value, and M is the modulus, and a phase register. The interpolator provides to the frequency divider an output which is a fractional value equal to, on average, the input fraction F/M. An enable signal applied to the synchronization circuit resets the interpolator with the predetermined phase adjustment value to vary the phase of the output signal with respect to the input reference signal.

This invention further features a fractional-N synthesizer with programmable output phase comprising: a phase locked loop having an output signal whose frequency is a fractional multiple of an input reference signal, said phase locked loop including a frequency divider. A phase adjustment circuit may be responsive to said input reference signal, an enable signal, a fraction (F), and a predetermined phase value, and a modulus (M), said phase adjustment circuit configured to generate a modified phase adjustment value. An interpolator may be responsive to said phase adjustment circuit to provide to said frequency divider an output which is a fractional value equal to, on average, an input fraction F/M varied by said modified phase adjustment value to vary the phase of said output signal by said modified phase adjustment value with respect to said input reference signal.

In one embodiment, the phase adjustment circuit may include a modulo-M counter for counting a predetermined number of reference clock cycles. The phase adjustment circuit may include a modulo-M multiplier responsive to said modulo-M counter and an input fraction for multiplying the number of reference clock edge cycles counted by the input fraction by said input fraction. The phase adjustment circuit may further include an additional modulo-M adder responsive to said modulo-M multiplier and a predetermined phase adjustment value for adding the result of said modulo-M multiplier and said predetermined phase adjustment value to produce said modified phase adjustment value.

This invention also features a fractional-N synthesizer with programmable output phase including a phase locked loop having an output signal whose frequency is a fractional multiple of an input reference signal. The phase locked loop includes a frequency divider, and a synchronization circuit responsive to the input reference signal for generating synchronization pulses at integer multiples of M periods of the input reference signal. An interpolator is responsive to F and M, where F is the fractional value, and M is the modulus, to provide to the frequency divider an output which is a fractional value equal to, on average, the input fraction. A phase adjustment circuit responsive to the synchronization circuit for varies the phase of the output signal with respect to the input reference signal. The phase adjustment circuit includes a switching circuit for selectively applying the fractional value and a modified fractional value to the interpolator to define a predetermined phase relationship between the output signal and the input reference signal.

This invention further features a method of varying the phase of the output signal with respect to the input signal of a fractional-N synthesizer. The method includes the steps of generating a synchronization pulse at integer multiples of periods of the input reference signal, and gating the synchronization pulse to re-initialize the interpolator of the fractional-N synthesizer to delay application of the synchronization pulse to define a predetermined phase relationship between the output signal and the input reference signal.

In one embodiment, the synchronization pulse may be delayed by a predetermined number of reference clock cycles to define the predetermined phase relationship.

This invention also features a method of varying the phase of the output signal with respect to the input signal of a fractional-N synthesizer. The method includes the steps of generating a synchronization pulse at integer multiples of periods of the input reference signal, and applying a fractional value and a modified fractional value to the interpolator of the fractional-N synthesizer to define a predetermined phase relationship between the output signal and the input reference signal.

This invention further features a method of varying the phase of the output signal with respect to the input signal of a fractional-N synthesizer. The method includes the steps of generating a synchronization pulse at integer multiples of periods of the input reference signal, generating a predetermined phase adjustment value, and generating an enable signal to reset the interpolator of the fractional-N synthesizer with the predetermined phase to vary the phase of the output signal with respect to the input reference signal.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
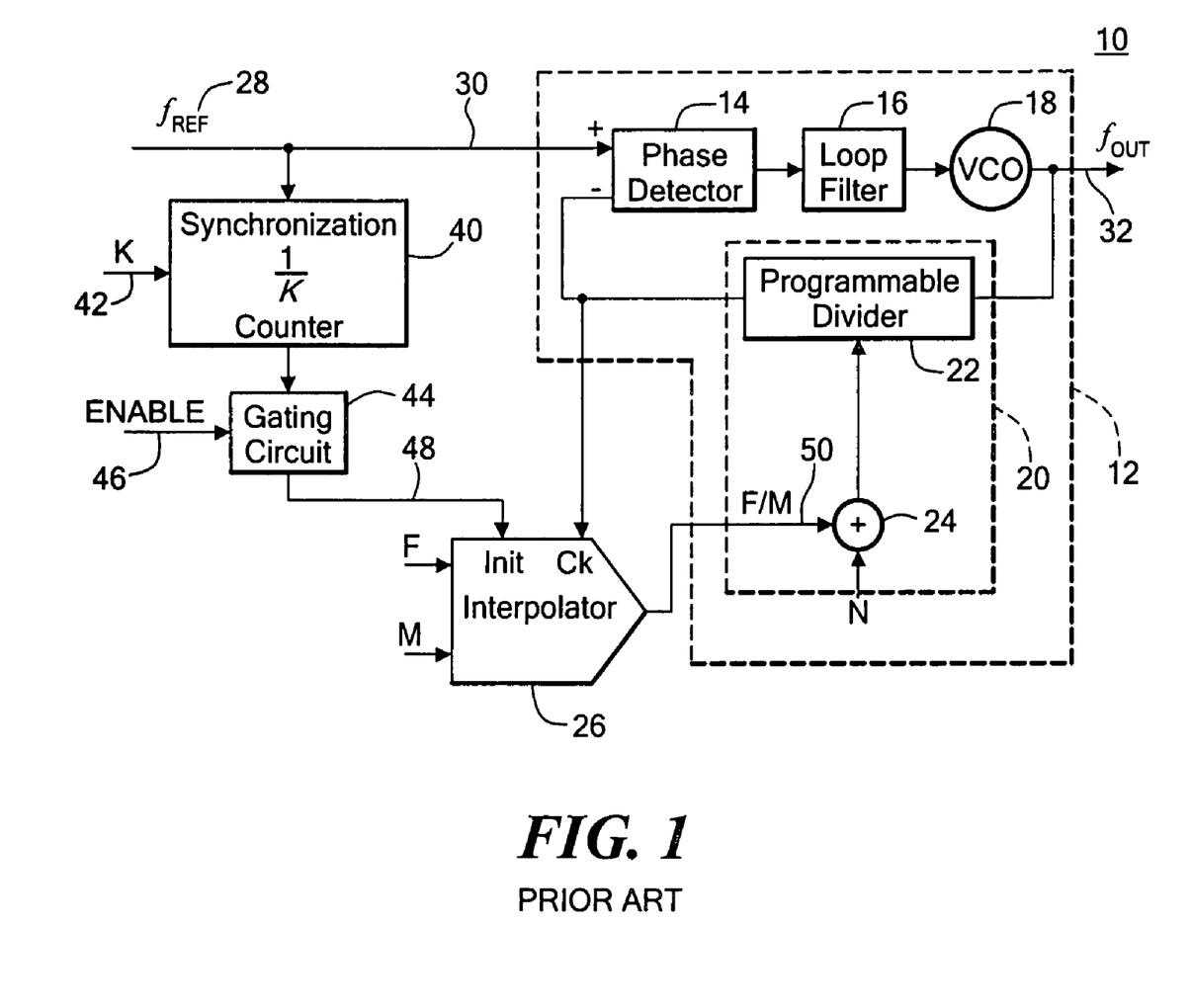
FIG. 1 is a schematic block diagram of a prior art fractional-N synthesizer in which the phase of the output signal is synchronized to the input reference signal.

As discussed in the Background section, prior art U.S. Pat. No. 6,556,086 discloses fractional-N synthesizer 10 with synchronized output phase which locks the output frequency, $f_{OUT}$, with input reference frequency, $f_{REF}$.

Prior art fractional-N synthesizer 10, FIG. 1 with synchronized output phase includes a phase locked loop (PLL) 12 including a phase detector 14, loop filter 16, voltage controlled oscillator (VCO) 18, and a frequency divider 20 which includes a programmable divider 22 and summing circuit 24. Interpolator 26 provides to summing circuit 24 the fractional input F/M, where F is typically the numerator of the fraction and M is the denominator or modulus. The integer portion N can be provided from an external source; the two are combined in summing circuit 24 to provide the divisor number to program divider 22.

In operation a reference frequency 28 ($f_{REF}$) is delivered at input 30 to the positive input of phase detector 14. Voltage controlled oscillator 18 provides an output signal $f_{OUT}$ on line 32, the frequency of which is a function of the voltage supplied to VCO 18. The frequency of the output signal on line 32 is divided by the divisor in programmable divider 22 and delivered back to the negative input of phase detector 14. Any difference in the phase of the two signals is detected by phase detector 14 and a signal representative thereof is provided to loop filter 16. Loop filter 16 integrates or averages the signal and provides a voltage to VCO 18 to increase or decrease the frequency of the output signal $f_{OUT}$ on line 32 until the inputs to phase detector 14 are balanced.

Each time phase locked loop 12 is switched to a different channel, that is, the frequency of its output, $f_{OUT}$, is changed by changing any one or more of the parameters F, M, N, the balancing process starts anew. However in fractional-N synthesizers the higher frequency output signal $f_{OUT}$ is only in phase with the input reference frequency 28 every M periods of the reference signal. More importantly the output will only be in phase with one of the M edges of the reference and which one of the M edges of the references it will be may be different each time the channel is switched or synthesized depending upon the particular state of the interpolator.

In accordance with prior art fractional-N synthesizer 10, the output frequency, $f_{OUT}$, can be reliably phase locked to the input reference frequency, $f_{REF}$, by using a synchronization counter 40 which is responsive to the input reference frequency, $f_{REF}$, (which does not change) to produce a synchronization pulse one out of every K times. K is a factor that may be programmable and introduced on line 42 or may be permanently stored in counter 40. K is equal to n×M where n is a whole number, e.g., 1, 2, 3 etc. These synchronization pulses are only passed by gating circuit 44 to interpolator 26 when an enable signal has been provided on line 46. Such an enable signal can be generated as a result, for example, of any change in the values F, M or N. Thus, when gating circuit 44 is enabled it passes a synchronization pulse from counter 40 on line 48 to the initializing input of interpolator 26. This sets interpolator 26 to its initial state at which it is known that the input reference frequency 28 and output frequency 32 are in phase and they will then continue to be in phase every M cycles. Interpolator 26 may be a simple adder circuit with a carry-out where the carry appears on line 50 as the fractional input to summer 24 or it may be a higher order sigma-delta modulator for example. The initialization of interpolator 26 may reset it to zero or may set it to any other predetermined setting for example, as may be used to randomize the output on line 50 to minimize noise.

However, prior art fractional-N synthesizer 10 cannot be programmed to vary the phase of output signal $f_{OUT}$ on line 32 with respect to the input reference signal $f_{REF}$.

Figure 2:
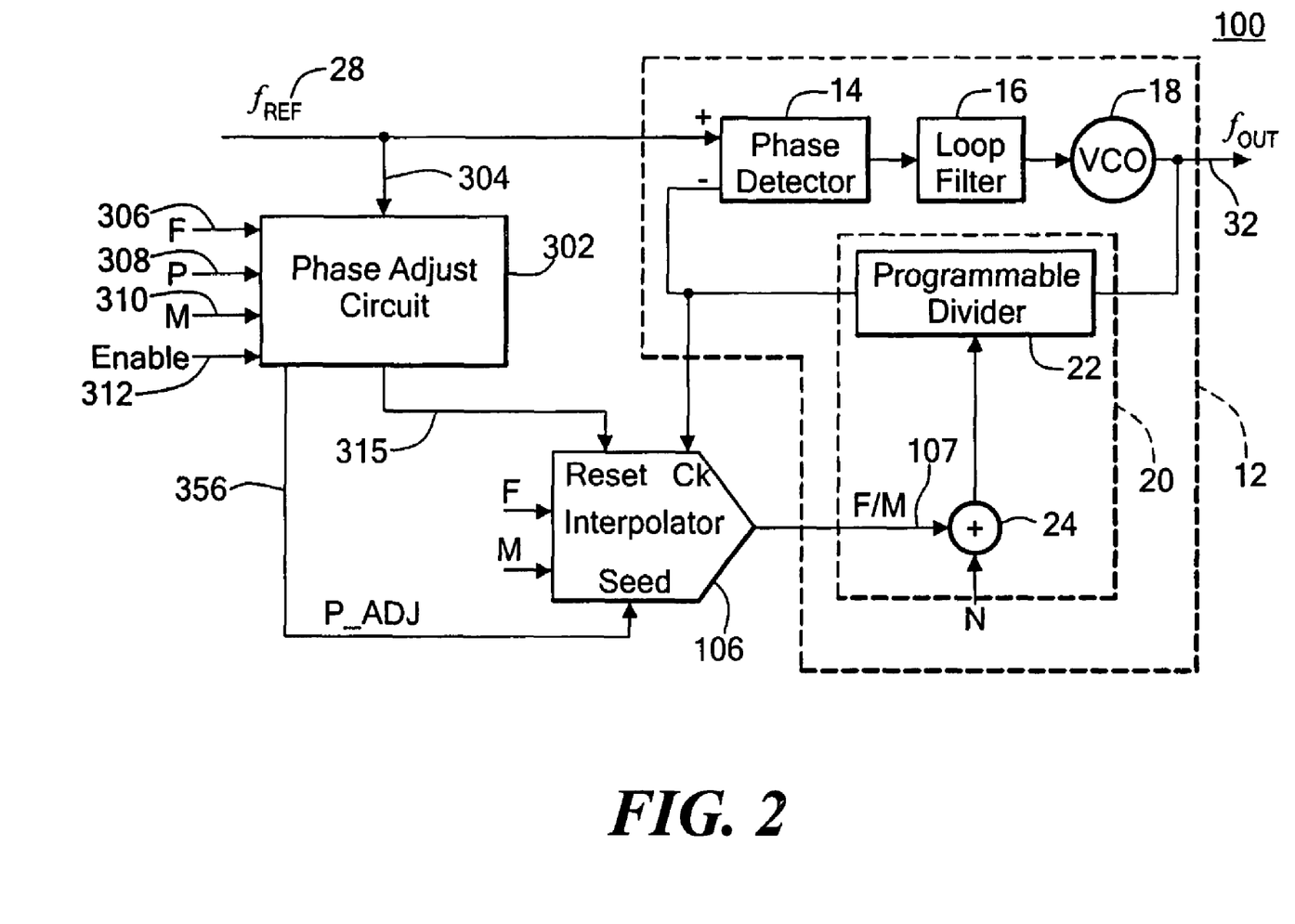
FIG. 2 is a schematic block diagram of one embodiment of the fractional-N synthesizer with programmable output phase of this invention.

In contrast, fractional-N synthesizer 100 with programmable output phase, FIG. 2, of this invention can be reliably programmed to vary the output phase of the output signal $f_{OUT}$ on line 32 with respect to the input reference signal $f_{REF}$ on line 28. Fractional-N synthesizer 100 includes phase lock loop 12 with phase detector 14, loop filter 16, voltage control oscillator 18 and frequency divider 20 which are configured and operate similar to prior art fractional-N synthesizer 10 described above.

Figure 3:
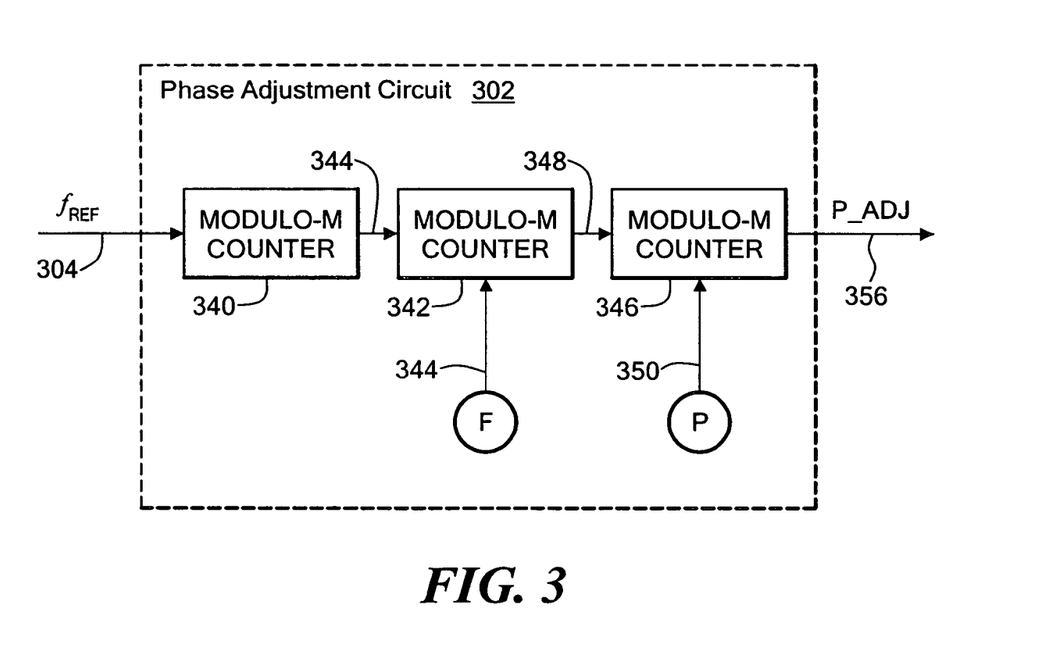
FIG. 3 is a schematic block diagram showing the in further detail the phase adjustment circuit shown in FIG. 2.

Phase adjustment circuit 302 is responsive to an input reference signal, $f_{REF}$, on line 304, and input fraction (F) on line 306, a predetermined phase adjustment value (P) on line 308, a modulus (M) on line 310 and an enable signal on line 312. Interpolator 106 is responsive to phase adjustment circuit 302 on line 356 and provides to frequency divider circuit 20 an output on line 107 which is a fractional value equal to, on average, the input fraction F/M offset by a modified phase adjustment value (P_ADJ), as described below. Phase adjustment circuit 302, FIG. 3 typically includes modulo-M-counter 340 responsive to input reference signal, $f_{REF}$, on line 304 and counts a predetermined number of reference clock edges, e.g., K modulo-M cycles since the last reset of interpolator 106. Modulo-M multiplier 342 is responsive to modulo-M counter on line 344 and input fraction F on line 344 and multiplies the number of clock reference cycles counted by modulo-M counter 340 by input fraction F to determine the how much phase has been accumulated since the last time interpolator 106 was reset. Modulo-M adder 346 is responsive to modulo-M multiplier 342 on line 348 and a predetermined phase adjustment value (P) on line 350 and adds the predetermined phase adjustment value (P) to the result of modulo-M multiplier 342 on line 348 to generate a desired modified (programmed) phase adjustment value (P_ADJ) on line 356. Modified phase adjustment value (P_ADJ) is loaded to interpolator 106, FIG. 2 on line 356 which changes the input fraction (F/M) on line 107 by the amount of the modified phase adjustment value (P_ADJ), e.g., a phase word with a size of 0 to M−1 which varies the phase of the output signal $f_{OUT}$ on line 32 by the amount of the modified fraction value P_ADJ.

Figure 4:
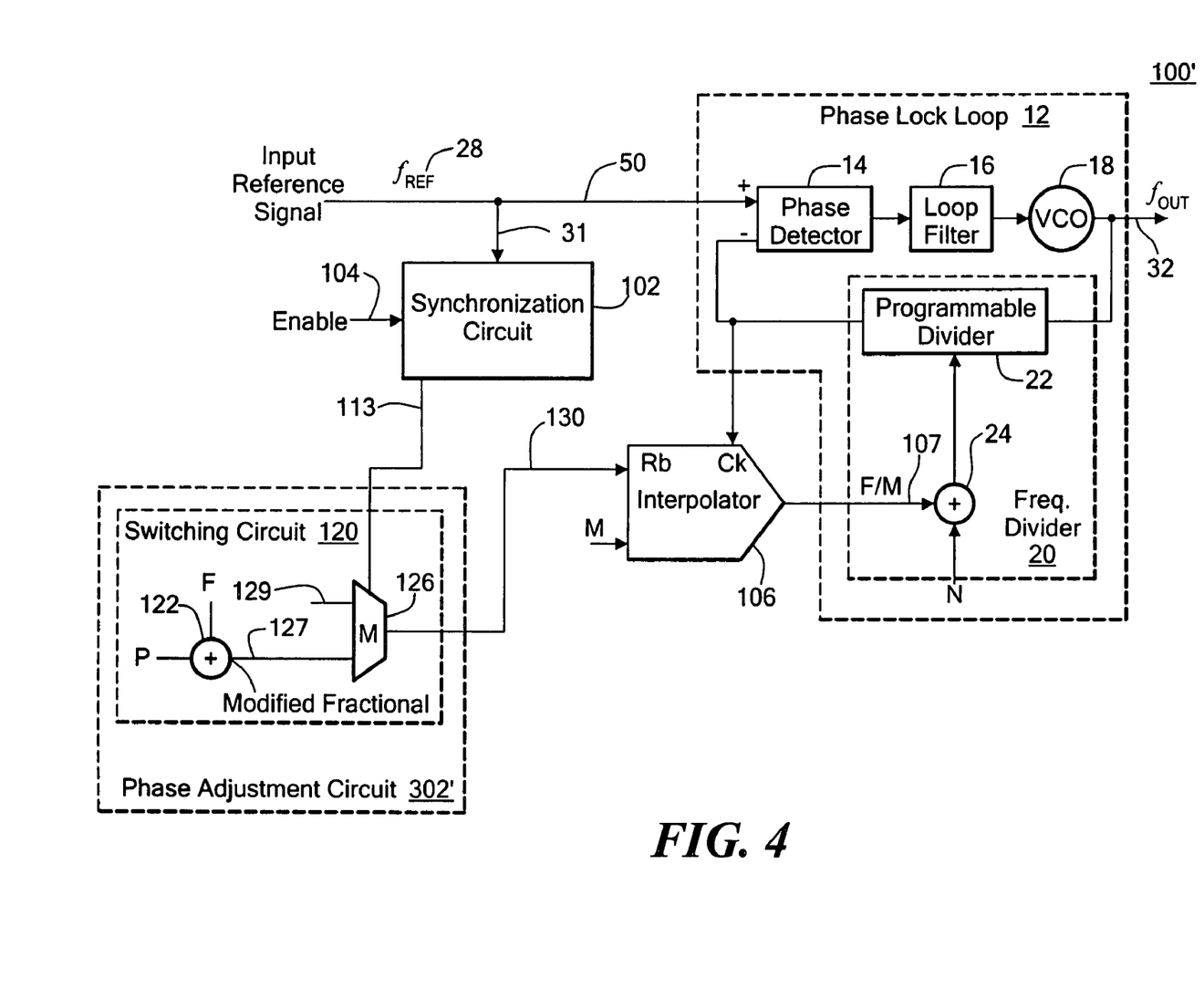
FIG. 4 is a schematic block diagram of another embodiment of the fractional-N synthesizer with programmable output phase of this invention.

Fractional-N synthesizer 100', FIG. 4, of this invention, where like parts have been given like numbers, includes phase adjustment circuit 302' which includes switching circuit 120 for selectively applying the fractional value (F) and a modified fractional value (F+P) to interpolator 106 on line 130 to vary the phase of the output signal, $f_{OUT}$, on line 32.

The output phase is programmed by changing the initial starting point of interpolator 106 by the modified fractional value (F+P) for one or more clock cycles which results in an offset in interpolator 106 which changes the input fraction (F/M) on line 107 by that amount which varies the phase of the output signal by the amount of the phase value (P).

Switching circuit 120 typically includes adder circuit 122 for adding the fractional value (F) and predetermined phase adjustment value (P) to define the modified fractional input (F+P). Switching circuit 120 also typically includes multiplexer 126 configured to select the modified fractional value (F+P) or the fractional value (F) for one or more reference cycles. Typically, the fractional value (F) is offset by a phase word to define the modified fractional value (F+P). The phase word may have a size of 0 to M−1.

By way of example only if M=100, if the desired phase shift is $$\left(\frac{7}{100}\right) \times 360°$$

and desired fraction is 3/100, F may be set to 3, P may be set to 7/100. On one reference clock cycle, multiplexer 126 selects the modified fractional input (F+P), e.g., 3+7, or 10, on line 127, and the fractional output F/M of interpolator 106 on line 107 will be 10/100. On the next clock cycle, multiplexer 126 may select the fractional value F, or 3, on line 129 and the fractional output of interpolator 106 on line 107 will be 3/100, which results in a phase shift of $$(7/100) \times 360° \left(\text{e.g., } \frac{10}{100} - \frac{3}{100}\right)$$

of the output signal for that clock cycle. Thereafter, the fractional value for F on line 127 may be maintained with a value of 3 to maintain the phase shift of (7/100)×360°, or an additional modified fractional input may be selected by multiplexer 126 to vary the phase of the output signal as needed.

Figure 5:
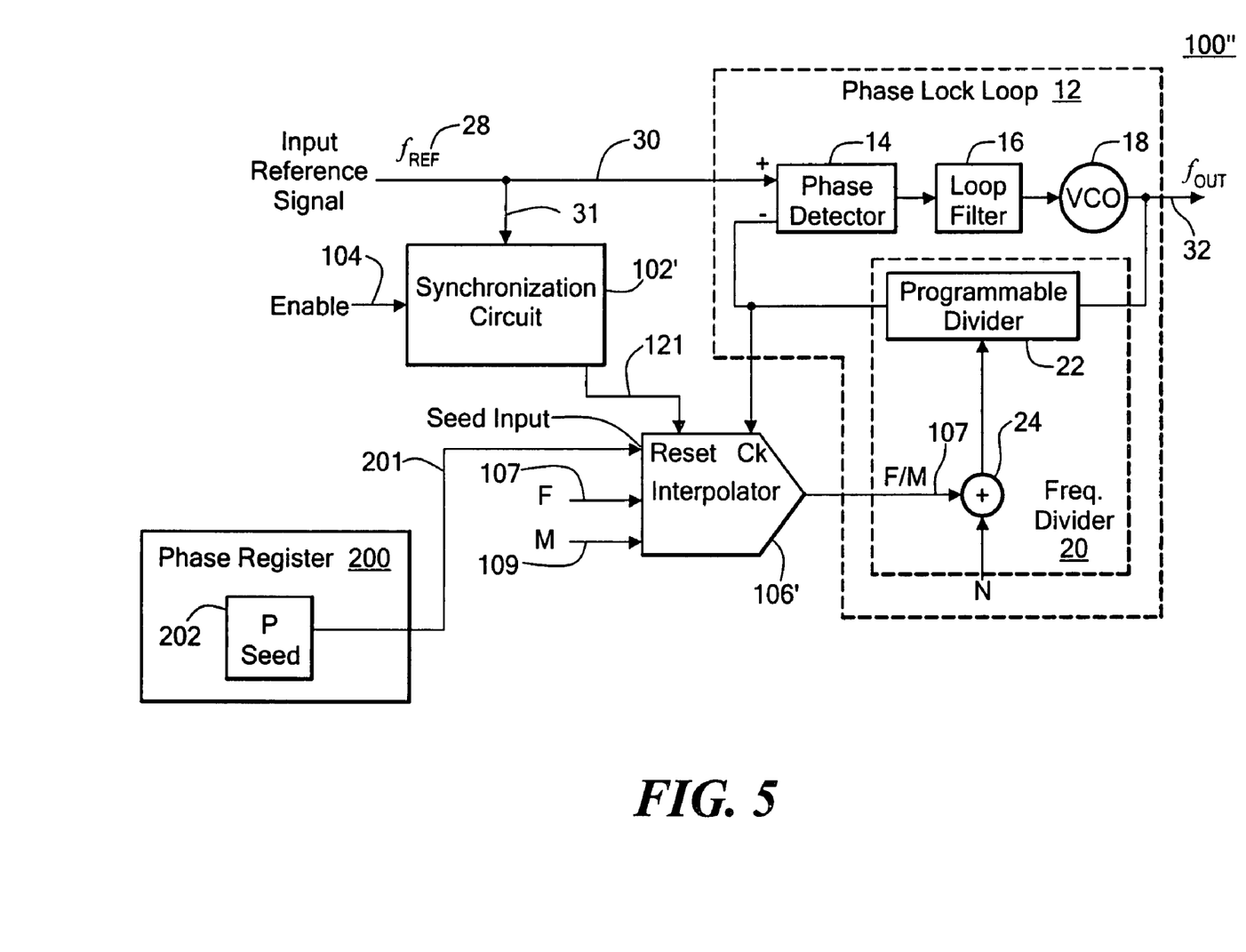
FIG. 5 is a schematic block diagram of yet another embodiment of the fractional-N synthesizer with programmable output phase of this invention.

Fractional-N synthesizer 100", FIG. 5 of this invention, where like parts have been given like numbers, similarly includes phase lock loop 12 with its various components and as described supra. Fractional-N synthesizer 100" also includes synchronization circuit 102' which is responsive to the input reference frequency $f_{REF}$ on line 31 to generate synchronization pulses at integer multiples of M periods of the input reference signal $f_{REF}$ on line 121. In this design, fractional-N synthesizer 100" includes phase register 200 configured to store a predetermined phase adjustment value (P), indicated at 202. The predetermined phase adjustment value may be a phase word with a value of 0 to M−1 which is $$\frac{P}{M} \times 360$$

in degrees. Interpolator 106' is responsive to input fraction F/M, where F is the fractional value on line 107 and M is the modulus on line 109, and phase register 200 on line 201. Interpolator 106' provides to frequency divider circuit 22 an output which is a fractional value equal to, on average, the input fraction (F/M) which is offset by the predetermined phase adjustment value (P) to vary the phase of the output signal $f_{REF}$ on line 32 by the amount of the predetermined phase adjustment value. An enable signal on line 104 causes synchronization circuit 102 to pass a synchronization pulse on line 121 to reset interpolator 106' with the predetermined phase adjustment value (P) from phase register 200.

By initializing the interpolator 106 with the predetermined phase adjustment value (P), or seed value, the output of interpolator 106 on line 107 is offset by that amount and varies the phase of the output signal. The output phase is related to the seed value (P) and the Modulus M by equation (4) below:

$$\phi_{rf} = \left(\frac{P}{M}\right) \times 2\pi \text{ radians} \quad (4)$$

Hence, varying the seed value (P) can be used to program Fractional-N synthesiser 100" to produce an output signal with any desired phase with a resolution of $$\frac{2\pi}{M}.$$

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A fractional-N synthesizer with programmable output phase comprising:
    a phase locked loop having an output signal whose frequency is a fractional multiple of an input reference signal, said phase locked loop including a frequency divider;
    a synchronization circuit responsive to said input reference signal for generating synchronization pulses at integer multiples of M periods of said input reference signal;
    an interpolator responsive to F and M, where F is a fractional value and M is the modulus, to provide to said frequency divider an output which is a fractional value equal to, on average, an input fraction F/M; and
    a phase adjustment circuit responsive to said synchronization circuit for varying the phase of said output signal with respect to said input reference signal.

2. The fractional-N synthesizer of claim 1 in which said phase adjustment circuit includes a switching circuit for selectively applying said fractional value and a modified fractional value to said interpolator to define a predetermined phase relationship between said output signal and said input reference signal.

3. The fractional-N synthesizer of claim 2 in which said switching circuit includes an adder circuit for adding said fraction value and a predetermined phase adjustment value to define said modified fractional value.

4. The fractional-N synthesizer of claim 3 in which said switching circuit includes a multiplexer configured to select said modified fractional value or said fractional value for one or more reference cycles.

5. The fractional-N synthesizer of claim 3 in which said fractional value is offset by a phase word to define said modified fractional value.

6. The fractional-N synthesizer of claim 5 in which said phase word has a size in the range of 0 to M−1.

7. A fractional-N synthesizer with programmable output phase comprising:
    a phase locked loop having an output signal whose frequency is a fractional multiple of an input reference signal, said phase locked loop including a frequency divider;

a synchronization circuit responsive to said input reference signal for generating synchronization pulses at integer multiples of M periods of said input reference signal;

a phase register including a predetermined phase adjustment value; and an interpolator responsive to F and M, where F is the fractional value, and M is the modulus, and said phase register, to provide to said frequency divider an output which is a fractional value equal to, on average, said input fraction, wherein an enable signal applied to said synchronization circuit resets said interpolator with said predetermined phase adjustment value to vary the phase of said output signal with respect to said input reference signal.

8. A fractional-N synthesizer with programmable output phase comprising:

a phase locked loop having an output signal whose frequency is a fractional multiple of an input reference signal, said phase locked loop including a frequency divider;

a phase adjustment circuit responsive to said input reference signal, an enable signal, a fraction (F), and a predetermined phase value, and a modulus (M), said phase adjustment circuit configured to generate a modified phase adjustment value; and an interpolator responsive to said phase adjustment circuit to provide to said frequency divider an output which is a fractional value equal to, on average, an input fraction F/M varied by said modified phase adjustment value to vary the phase of said output signal with respect to said input reference signal.

9. The fractional-N synthesizer of claim 8 in which said phase adjustment circuit includes a modulo-M counter for counting a predetermined number of reference clock cycles.

10. The fractional-N synthesizer of claim 9 in which said phase adjustment circuit includes a modulo-M multiplier responsive to said modulo-M counter and an input fraction for multiplying the number of reference clock edge edges counted by the input fraction by said input fraction.

11. The fractional-N synthesizer of claim 10 in which said phase adjustment circuit further includes an additional modulo-M adder responsive to said modulo-M multiplier and a predetermined phase adjustment value for adding the result of said modulo-M multiplier and said predetermined phase adjustment value to produce said modified phase adjustment value.

12. A fractional-N synthesizer with programmable output phase comprising:

a phase locked loop having an output signal whose frequency is a fractional multiple of an input reference signal, said phase locked loop including a frequency divider;

a synchronization circuit responsive to said input reference signal for generating synchronization pulses at integer multiples of M periods of said input reference signal;

an interpolator responsive to F and M, where F is the fractional value and M is the modulus, to provide to said frequency divider an output which is a fractional value equal to, on average, said input fraction; and a phase adjustment circuit responsive to said synchronization circuit for varying the phase of said output signal with respect to said input reference signal, said phase adjustment circuit including a switching circuit for selectively applying said fractional value and a modified fractional value to said interpolator to define a predetermined phase relationship between said output signal and said input reference signal.

13. A method of varying the phase of the output signal with respect to the input reference signal of a fractional-N synthesizer, the method comprising:

generating a synchronization pulse at integer multiples of M periods of the input reference signal where M is modulus; and selectively applying a fractional value and a modified said fractional value to an interpolator of said fractional-N synthesizer to define a predetermined phase relationship between said output signal and said input reference signal.

\* \* \* \* \*